United States Patent
Mori et al.

(10) Patent No.: US 6,791,354 B2
(45) Date of Patent: Sep. 14, 2004

(54) SEMICONDUCTOR INTEGRATED CIRCUIT

(75) Inventors: Kaoru Mori, Kawasaki (JP); Shinichi Yamada, Kawasaki (JP); Masato Takita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 431 days.

(21) Appl. No.: 10/032,465

(22) Filed: Jan. 2, 2002

(65) Prior Publication Data

US 2004/0013023 A1 Jan. 22, 2004

(30) Foreign Application Priority Data

May 25, 2001 (JP) ........................................ 2001-156687

(51) Int. Cl.$^7$ ................................................. G06F 7/38
(52) U.S. Cl. .......................... 326/40; 326/31; 365/227
(58) Field of Search ............................ 326/39, 40, 46, 326/31; 365/184, 226, 227

(56) References Cited

U.S. PATENT DOCUMENTS 6,091,656 A * 7/2000 Ooishi ........................ 365/226

FOREIGN PATENT DOCUMENTS

JP 05210976 A * 8/1993 ......... G11C/11/405

* cited by examiner

Primary Examiner—Daniel D. Chang
(74) Attorney, Agent, or Firm—Arent Fox, PLLC

(57) ABSTRACT

A plurality of switching transistors is provided, each connects power supply terminals of a plurality of first circuit blocks to a power supply line, respectively. Among the first circuit blocks, the power supply terminals of the first circuit blocks operating at different timings are connected by an internal power supply line. A power supply control circuit simultaneously turns on the switching transistors connected to the internal power supply line, in response to operation(s) of at least any one of the first circuit blocks connected to the internal power supply line. Since the switching transistors can be shared among the first circuit blocks not operating simultaneously, operation speed of the first circuit blocks can be increased. Since a total size of the switching transistors can be made small, standby current can be decreased. Accordingly, a semiconductor integrated circuit operating at a high speed can be constituted without increasing the standby current.

16 Claims, 11 Drawing Sheets

SEMICONDUCTOR INTEGRATED CIRCUIT

BACKGROUND OF THE INVENTION

1. Field of the Invention

The present invention relates to a semiconductor integrated circuit, more particularly to a semiconductor integrated circuit having memory cell arrays arranged in a matrix form.

2. Description of the Related Art

To respond to requests for a decrease in a breakdown voltage of a gate oxide film and lower power consumption by micro-fabricating a transistor structure, a power source voltage (operation voltage) of a semiconductor integrated circuit has recently become low. A transistor operates at a higher speed, in proportion as an effective gate voltage which is a value obtained by subtracting its threshold voltage from its operation voltage is higher. However, since the threshold voltage of the transistor is little dependent on the power source voltage, the effective gate voltage of the transistor becomes low according to a decrease in the power source voltage. Consequently, an operation speed of the transistor is made slower in proportion as the power source voltage is lower.

To maintain the high-speed operation of the transistor, the effective gate voltage of the transistor needs to be maintained by decreasing its threshold voltage in accordance with a drop of the power source voltage. Meanwhile, as the threshold voltage of the transistor becomes lower, a sub-threshold leak current, which flows between a drain and a source of the transistor even if a gate-source voltage of the transistor is made to equal to 0 V, increases. Therefore, if the threshold voltage of the transistor is dropped to maintain its high-speed operation, a standby current of the semiconductor integrated circuit increases.

A technology is disclosed in Japanese Unexamined Patent Application Publication No. Hei 5(1993)-210976, in which a switching transistor is disposed between a power supply line and a source electrode of a transistor to decrease a standby current. Even when a threshold voltage of the transistor is decreased, this technology prevents the standby current from being increased by turning off the switching transistor during a standby state.

However, since the switching transistor acts as a load on the power supply line when an internal circuit of a semiconductor integrated circuit operates, there has been a problem that the arrangement of the switching transistor decreases an operation speed of the circuit. It is possible to prevent a decrease in the operation speed of the circuit by making a size of the switching transistor large. However, in this case, because a sub-threshold leak current of the switching transistor increases, the standby current increases. Accordingly, when the switching transistor is arranged between the circuit and the power supply line, it has been difficult to satisfy both of the operation speed of the circuit and the standby current.

In Japanese Unexamined Patent Application Publication No. Hei 8(1996)-321763, a technology is disclosed, in which by applying a voltage different from a power source voltage to a gate of a switching transistor, an internal circuit is allowed to operate at a high speed and an increase in a standby current is controlled. In this technology, a gate-source voltage of the switching transistor is made to be high during an operation of the internal circuit, whereby a capability to supply a current to the internal circuit is enhanced. The gate-source voltage of the switching transistor is made to be negative during the standby of the internal circuit, whereby a cutoff characteristic is improved.

However, in order to set the gate-source voltage of the switching transistor to a voltage different from the power source voltage, a voltage generating circuit (a high voltage generating circuit, a negative voltage generating circuit or the like) is necessary. Therefore, there has been a problem that an extra current is consumed by the voltage generating circuit and the standby current cannot be decreased as the whole semiconductor integrated circuit even when the cutoff characteristic during the standby state is improved. Moreover, since amplitude of a gate voltage of the switching transistor becomes large, a charge and discharge current for a gate capacitance increases. Accordingly, when a change between an active state and a standby state is often made, there has been a problem that consumption current increase.

SUMMARY OF THE INVENTION

An object of the present invention is to provide a semiconductor integrated circuit capable of decreasing current consumption during a standby state of the semiconductor integrated circuit without lowering the operation speed of the circuit.

According to one of the aspects of the present invention, a semiconductor integrated circuit has a plurality of switching transistors which connect power supply terminals of a plurality of first circuit blocks to a power supply line, respectively. The power supply terminals of the first circuit blocks operating at different timings among the first circuit blocks are connected to each other by an internal power supply line. A power supply control circuit simultaneously turns on the switching transistors connected to the internal power supply line in response to operation(s) of at least any one of the first circuit blocks connected to the internal power supply line. Therefore, when a certain first circuit block operates, a power source current is supplied to the first circuit block via the plurality of switching transistors. Since a total size of the switching transistors for the first circuit block in operation can be made large, a power source resistance (or a ground resistance) of a power source connected to the first circuit block can be decreased and an operation speed of the first circuit block can be increased compared to that of conventional art.

Since the plurality of switching transistors can be shared among the first circuit blocks which do not operate simultaneously, the total size of the switching transistors can be made smaller compared to a case where the switching transistors are arranged for each of the first circuit blocks. As a result, an increase in a total sum of sub-threshold currents of the switching transistors can be prevented when the first circuit blocks do not operate, and a current when the first circuit blocks do not operate (standby current) can be decreased. Furthermore, since the switching transistors can be shared among the first circuit blocks which do not operate simultaneously, each chip size can be made small.

Accordingly, a semiconductor integrated circuit operating at a high speed can be constituted without increasing the standby current. Particularly, in a semiconductor integrated circuit constituting the first circuit blocks including internal transistors with decreased threshold voltages, both the operation speed and the standby current can be satisfied.

According to another aspect of the present invention, threshold voltages of the switching transistors are set to be higher than those of internal transistors included in the first circuit blocks. Since the plurality of switching transistors are connected to each other in parallel, even when the threshold voltages of the switching transistors are made higher and the sub-threshold leak current is further decreased, drivability of the switching transistors can be made equal to those before the threshold voltages thereof are made higher, by only making sizes of the respective switching transistors a little larger. More specifically, an increase in the chip size can be suppressed to the minimum, and the sub-threshold leak current can be further decreased.

According to another aspect of the present invention, source electrodes of the internal transistors turned off during a standby state of the semiconductor integrated circuit in each of the first circuit blocks are connected to the power supply line via the internal power supply line and the switching transistors. The switching transistors are connected only to such internal transistors as necessary for decreasing the standby current and the other internal transistors are directly connected to the power supply line, whereby the first circuit blocks can be operated at a higher speed and logic of the circuits can be determined even when the semiconductor integrated circuit is under the standby state.

According to another aspect of the present invention, the switching transistors and the first circuit blocks are dispersedly arranged. For example, a semiconductor integrated circuit capable of satisfying both an operation speed and a standby current without increasing the chip size can be constituted by arranging the switching transistors and the first circuit blocks, taking advantage of empty areas where no devices are formed.

According to another aspect of the present invention, the switching transistors and the first circuit blocks are arranged in a matrix form with intervals in between. The internal power supply line connects to each other the power supply terminals of the part of the first circuit blocks, the connection done along a line with a smaller number of first circuit blocks operating simultaneously. Therefore, the number of the switching transistors for the first circuit blocks in operation can be increased, and a current supply capability per first circuit block can be enhanced. As a result, the first circuit blocks can be operated at a high speed.

According to another aspect of the present invention, a plurality of rectangular memory cell arrays is arranged in a matrix form with intervals in between. Each memory cell array has memory cells each connected to a word line and a bit line. For example, the semiconductor integrated circuit is constituted as a semiconductor memory or a system LSI including a semiconductor memory. In areas adjacent to four corners of the memory cell arrays, the switching transistors and the first circuit blocks are arranged. In each first circuit block, array control circuits for controlling the memory cell arrays are formed. The internal power supply line connects power supply terminals of the array control circuits to each other, which are aligned in wiring directions of the word line or the bit line. Generally, when data is read/written from/to the semiconductor memory, a part of the array control circuits operates, and only a predetermined memory cell array is selected in response to an address signal. At this time, the other part of array control circuits and the other memory cell arrays do not operate. Therefore, by connecting the array control circuits which operate at different timings (that is, do not operate simultaneously) to each other, by the internal power supply line, the number of the switching transistors to the array control circuits in operation can be increased and a current supply capability per array control circuit can be enhanced. As a result, the array control circuits can be operated at a high speed and access time of the semiconductor memory can be shortened.

According to another aspect of the present invention, column control circuits (the array control circuits) for inputting/outputting data transmitted to the bit line are connected by the internal power supply line. By connecting the column control circuits operating at different timings to each other, by the internal power supply line, the number of the switching transistors to the column control circuits in operation can be increased and a current supply capability per column control circuit can be enhanced. As a result, the column control circuits can be operated at a high speed and column operation time of the semiconductor memory can be shortened.

According to another aspect of the present invention, row control circuits (the array control circuits) for selecting the word line are connected by the internal power supply line. By connecting the row control circuits operating at different timings to each other, by the internal power supply line, the number of the switching transistors to the row control circuits in operation can be increased and a current supply capability per row control circuit can be enhanced. As a result, the row control circuits can be operated at a high speed and a row operation time of the semiconductor memory can be shortened.

According to another aspect of the present invention, a column control circuit for inputting/outputting data transmitted to the bit line and a row control circuit for selecting the word line are connected to each other by the internal power supply line. Generally, when data is read/written from/to a semiconductor memory, the row control circuits operate first, then the column control circuits operate. More specifically, the row control circuits and the column control circuits operate at different timings from each other. Therefore, the number of the switching transistors to the row control circuits and the column control circuits in operation can be increased. Accordingly, the row control circuits and the column control circuits can be operated at a high speed and access time of the semiconductor memory can be shortened.

According to another aspect of the present invention, a read control circuit operating during a read operation and a write control circuit operating during a write operation are connected by the internal power supply line. The read operation and the write operation never occur simultaneously. More specifically, the read control circuits and the write control circuits always operate at different timings from each other. Since the number of the switching transistors for the read control circuits and the write control circuits in operation can be increased, the read control circuits and the write control circuits can be operated at a high speed. As a result, read and write operation times of the semiconductor memory can be shortened.

According to another aspect of the present invention, second circuit blocks which operate at different timings from the first circuit blocks are respectively arranged between the first circuit blocks connected by the internal power supply line. Power supply lines of the second circuit blocks are connected to the internal power supply line. By connecting to each other the first/second circuit blocks operating at different timings by the internal power supply line, the number of the switching transistors for the first/second circuit blocks in operation can be increased, and a current supply capability per first/second circuit block can be enhanced. As a result, the first/second circuit blocks can be operated at a high speed.

According to another aspect of the present invention, source electrodes of the internal transistors turned off during a standby state of the semiconductor integrated circuit in each of the second circuit blocks are connected to the power supply line via the internal power supply line and the switching transistors. The switching transistors are connected only to such internal transistors as necessary for decreasing the standby current and the other internal transistors are directly connected to the power supply line, whereby the second circuit blocks can be operated at a higher speed and a logic of the circuits can be determined even when the semiconductor integrated circuit is under the standby state.

According to another aspect of the present invention, the second circuit blocks operate at different timings from each other. By connecting the second circuit blocks operating at different timings to each other by the internal power supply line, the number of the switching transistors to the second circuit blocks in operation can be increased and a current supply capability per second circuit block can be enhanced. As a result, the second circuit blocks can be operated at a high speed.

According to another aspect of the present invention, a plurality of memory cell arrays is provided, each having memory cells each connected to a word line and a bit line. For example, a semiconductor integrated circuit is constituted as a semiconductor memory or a system LSI including a semiconductor memory. Column control circuits (the first circuit blocks) for inputting/outputting data transmitted to the bit line and row control circuits (the second circuit blocks) for selecting the word line are connected to each other by the internal power supply line. Generally, when data is read/written from/to the semiconductor memory, the row control circuits operate first, then the column control circuits operate. More specifically, the row control circuits and the column control circuits operate at different timings from each other. Therefore, the number of the switching transistors for the row control circuits or the column control circuits in operation can be increased. Accordingly, the row control circuits and the column control circuits can be operated at a high speed, and access time of the semiconductor memory can be shortened.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the accompanying drawings.

Figure 1:
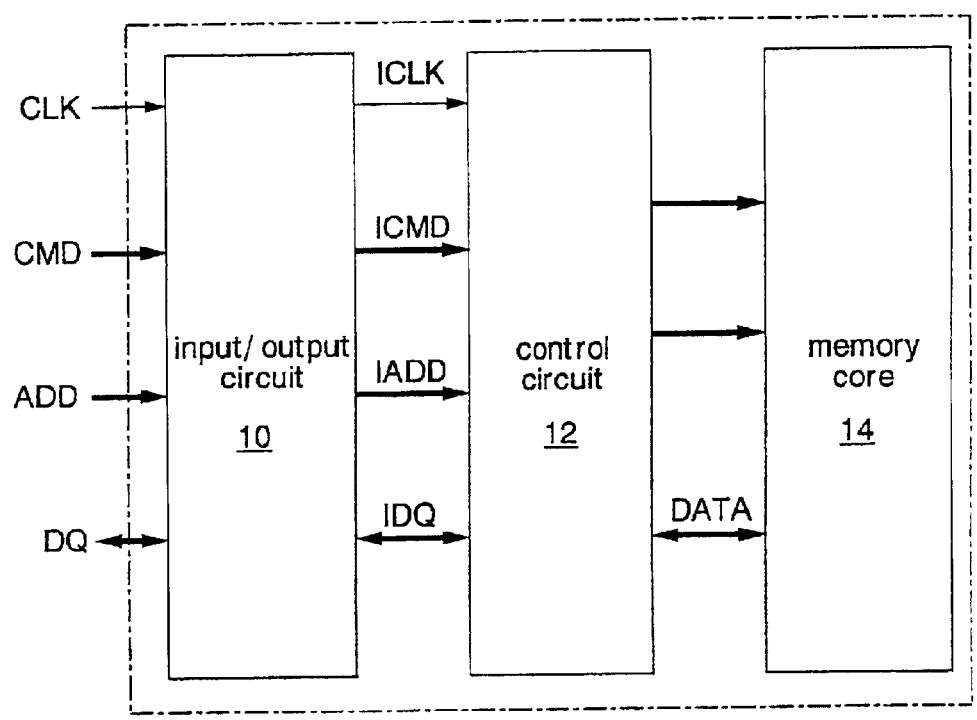
FIG. 1 is a block diagram showing a first embodiment of the present invention.

FIG. 1 shows a first embodiment of a semiconductor integrated circuit of the present invention. Thick signal lines in FIG. 1 indicate that each line is constituted by a plurality of lines. This semiconductor integrated circuit is formed as an SDRAM on a silicon substrate by use of CMOS processes.

The SDRAM has an input/output circuit 10, a control circuit 12 and a memory core 14. The input/output circuit 10 receives a clock signal CLK, a command signal CMD and an address signal ADD from the exterior of the memory, and outputs an internal clock signal ICLK, an internal command signal ICMD and an internal address signal IADD. The input/output circuit 10 receives/outputs a data signal DQ from/to the exterior of the memory and also receives/outputs the internal data signal IDQ from/to the control circuit 12.

The control circuit 12 outputs control signals for operating the memory core 14 in response to the internal clock signal ICLK, the internal command signal ICMD and the internal address signal IADD. The control circuit 12 outputs data DATA (reading data), which is output from the memory core 14 during the read operation, to the input/output circuit 10 as the internal data signal IDQ. During the write operation, the control circuit 12 outputs the internal data signal IDQ (writing signal) from the input/output circuit 10 to the memory core 14 as the data signal DATA.

Figure 2:
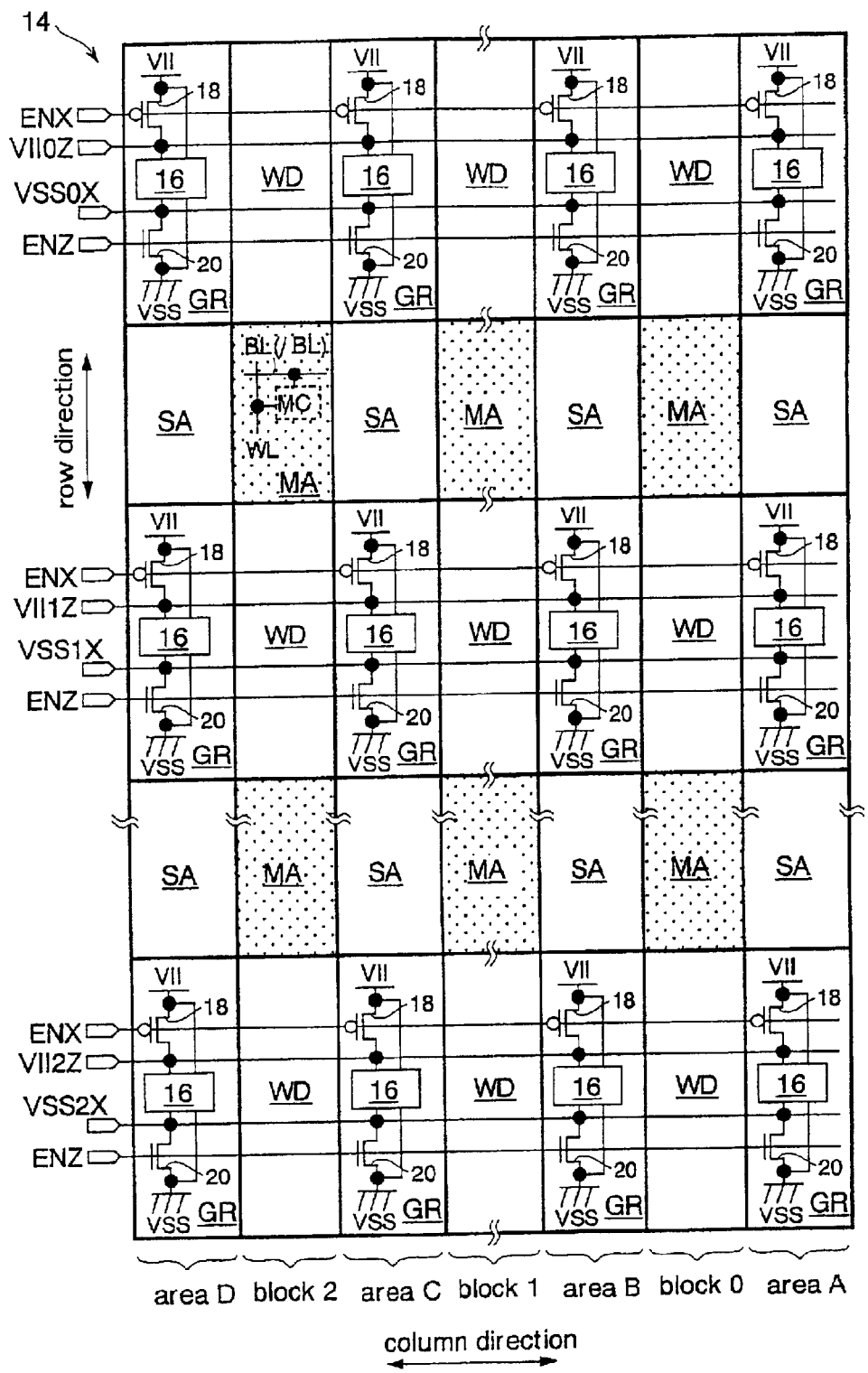
FIG. 2 is a block diagram showing the details of a memory core of FIG. 1.

FIG. 2 shows the details of the memory core 14 of FIG. 1. The memory core 14 has a plurality of memory cell arrays MA arranged with intervals in between in a matrix form. Each memory cell array MA has memory cells MC, each of them is connected to a word line WL and each of complementary bit lines BL and /BL. Hereinafter, a wiring direction of the word line WL is referred to as a row direction (a longitudinal direction of FIG. 2), and a wiring direction of the bit lines BL and /BL is referred to as a column direction (a lateral direction of FIG. 2).

Word decoder arrays WD are arranged in areas aligned in the column direction among areas adjacent to four sides of each memory cell array MA. Each word decoder in the word decoder arrays WD decodes the address signal ADD (row address signal), and selects a predetermined word line WL. Sense amplifier arrays SA are arranged in areas aligned in the row direction among the areas adjacent to the four sides of the respective memory cell arrays MA. Each sense amplifier of the sense amplifier array SA is connected to the bit lines BL and /BL, and amplifies a signal amount of data transmitted onto the bit lines BL and /BL. Hereinafter, the areas composed of the memory cell arrays MA and the word decoder arrays WD are referred to as blocks 0, 1 and 2 first from the right of FIG. 2, respectively, and the areas including the sense amplifier array SA aligned in the row direction are referred to as areas A, B, C and D first from the right of FIG. 2, respectively.

In this embodiment, during the read and write operations, word decoder arrays WD, the memory cell arrays MA and the sense amplifier arrays SA aligned in a row direction are simultaneously activated. For example, when the memory cell arrays MA of the block 1 are activated, the word decoder arrays WD of the block 1 are activated, and the sense amplifier arrays SA of the areas B and C located on both sides of the block 1 are activated. At this time, the memory cell arrays MA of the block 0 are separated from the sense amplifier arrays SA of the area B, while the memory cell arrays MA of the block 2 are separated from the sense amplifier arrays SA of the area C. In other words, in this embodiment, each of the sense amplifier arrays SA has a shared sense amplifier structure shared by the memory cell arrays MA on both sides thereof. Moreover, control circuits such as a column decoder, a read buffer and a write amplifier, in operation in response to column addresses, are arranged exterior of each sense amplifier array SA of the areas A and D.

In areas adjacent to the four corners of the memory cell array MA, that is, in areas between the word decoder arrays WD aligned in the column direction as well as in areas between the sense amplifier arrays SA aligned in the row direction, circuit groups GR are arranged, respectively. Each circuit group GR has a circuit blocks 16, a pMOS transistor 18 (hereinafter referred to as a pMOS 18) and an nMOS transistor 20 (hereinafter referred to as an nMOS 20). More specifically, each of the circuit blocks 16, the pMOSs 18 and the nMOSs 20 are arranged dispersedly in the memory core 14, and the circuit groups GR are arranged in a matrix form with intervals in between.

The pMOS 18 has a source electrode (hereinafter simply referred to as a source) connected to a power supply line VII, a drain electrode (hereinafter simply referred to as a drain) connected to a power supply terminal (not shown) of the circuit block 16, and a gate electrode (hereinafter simply referred to as a gate) receiving an enable signal ENX. The nMOS 20 has a source connected to a ground line VSS that is another power supply line, a drain connected to another power supply terminal (not shown) of the circuit block 16, and a gate receiving an enable signal ENZ. The pMOS 18 and the nMOS 20 operate as switching transistors for contacting the power supply line VII and the ground line VSS to the circuit block 16, respectively. Noted that the signal denoted by reference symbol with "X" in its end represents a negative logic and the signal denoted by reference symbol with "Z" in its end represents a positive logic.

The enable signal ENX becomes low in its level during an operation of the memory core 14 (in an active state of the memory core 14), and high in its level during a non-operation thereof (in a standby state thereof). The enable signal ENZ becomes high in its level during the operation of the memory core 14, and low in its level during the non-operation thereof. The enable signals ENX and ENZ are generated, for example, by a power supply control circuit (not shown) constituted in the control circuit 12 shown in FIG. 1. The power supply control circuit has a function simultaneously turning on the plurality of pMOSs 18 and nMOSs 20, which are connected to the internal power supply lines VIIZ and VSSX (to be described later), in response to at least one of operations of the circuit blocks 16 connected to the internal power supply lines VIIZ and VSSX. Noted that the circuit blocks 16 shown in FIG. 2 are directly connected also to the power supply line VII and the ground line VSS.

The drains of the pMOSs 18 and the nMOSs 20 in the circuit groups GR, which are aligned in the column direction to interpose the word decoder array WD in between, are respectively connected to each other through the internal power supply lines VIIZ and VSSX (VII0Z, VII1Z, . . . , VIInZ, VSS0X, VSS1X, . . . , VSSnX). More specifically, the pMOSs 18 and the nMOSs 20 in the column direction are shared among the circuit blocks 16 in operation at different timings. Since the circuits in the circuit block 16 and the power supply line VII (or VSS) are connected through the plurality of pMOSs 18 (or the nMOSs 20) arranged in parallel, a total drivability of the pMOSs 18 (or the nMOSs 20) for the operating circuit is high. The drivability is represented, for example, by a total sum of gate widths W/gate lengths L of the transistors.

In this embodiment, as described above, the control circuit such as the word decoder array WD and the sense amplifier array SA operates for each block unit and for each area unit aligned in the row direction. Similarly, the circuit blocks 16 aligned in the row direction operate simultaneously, and the circuit blocks 16 aligned in the column direction are operated two by two. In other words, the plurality of circuit blocks 16 aligned in the column direction operates at different timings. The internal power supply lines VIIZ and VSSX connect the circuits to each other, which are arranged in circuit blocks 16 aligned along a line with a smaller number of circuit blocks 16 operating simultaneously.

Figure 3:
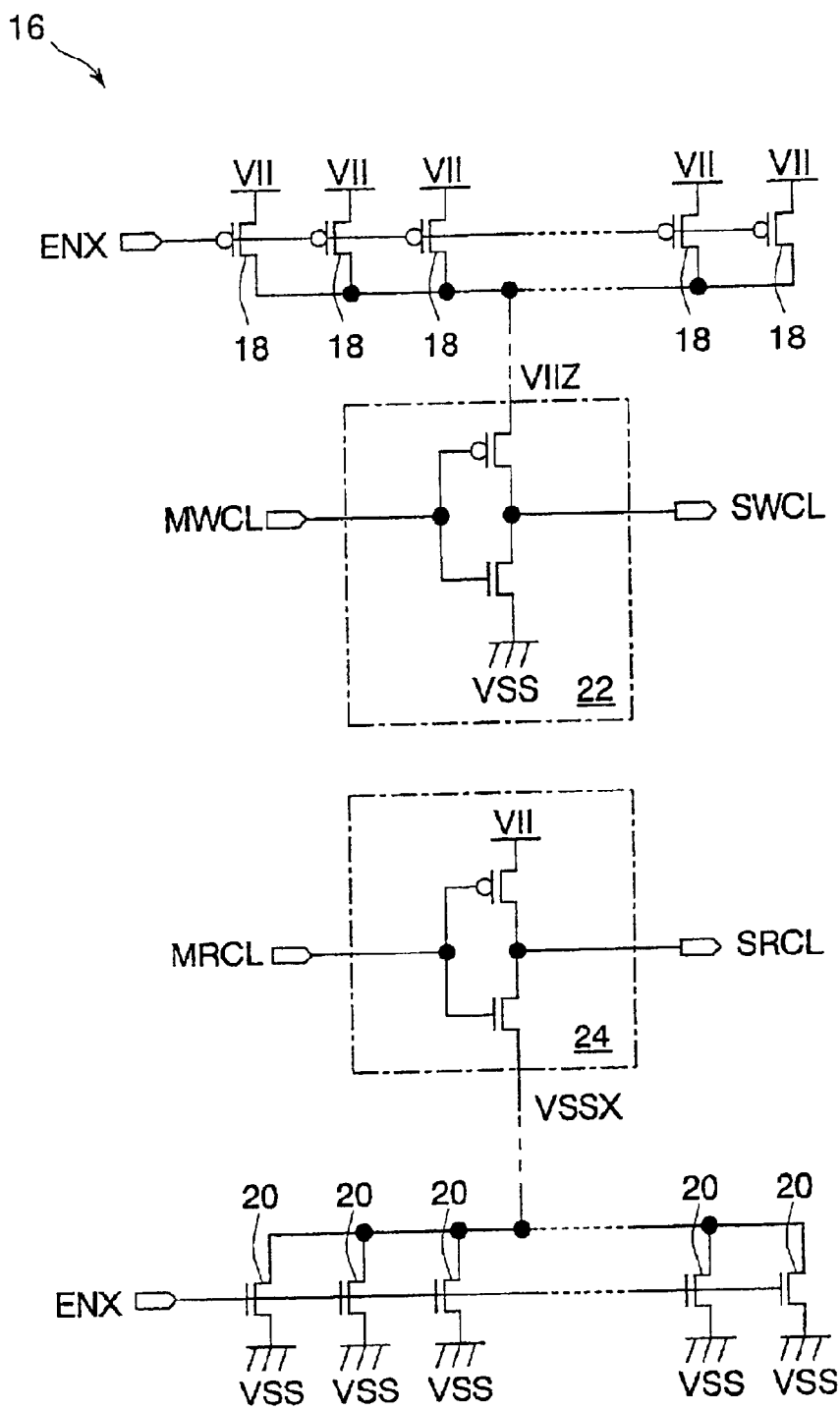
FIG. 3 is a circuit diagram showing examples of a WCL driving circuit and a RCL driving circuit which are arranged in the circuit block of FIG. 2.

FIG. 3 illustrates an example of a WCL driving circuit 22 and a RCL driving circuit 24, which are arranged in the circuit block 16. The WCL driving circuit 22 and the RCL driving circuit 24 are column control circuits (array control circuits for controlling the memory cell array MA) for controlling an input/output of data transmitted to the bit lines BL and /BL in response to a column address signal. Notes that besides these circuits, a sense amplifier driving circuit (a control circuit in a row system) for controlling the sense amplifier array SA and the like are arranged in the circuit block 16.

The WCL driving circuit 22 is constituted by a CMOS inverter in which the source (the power supply terminal) of the pMOS is connected to the internal power supply line VIIZ and the source of the nMOS is connected to the ground line VSS. The WCL driving circuit 22 receives a main write column line signal MWCL, and inverts the received signal to output it as a sub-write column line signal SWCL. The main write column line signal MWCL is held at high level during the standby state. At this time, the pMOS is turned off. More specifically, in the WCL driving circuit 22, the source of the pMOS (internal transistor) which is turned off during the standby state is connected to the power supply line VII via the plurality of pMOSs 18 aligned in the lateral direction of FIG. 2.

The RCL driving circuit 24 is constituted by a CMOS inverter in which the source of the pMOS is connected to the power supply lines VII, and the source (the power supply terminals) of the nMOS is connected to the internal power supply line VSSX. The RCL circuit 24 receives a main read column line signal MRCL, and inverts the received signal to output it as a sub read column line signal SRCL. The main read column line signal MRCL is held at a low level during the standby state. At this time, the nMOS is turned off. More specifically, in the RCL driving circuit 24, the source of the nMOS (internal transistor) which is turned off during the standby state is connected to the ground lines VSS (the power supply lines) via the plurality of nMOSs 20 aligned in the lateral direction of FIG. 2.

As shown in FIG. 2, the internal power supply lines VIIZ and VSSX are wired along the wiring direction of the bit lines BL and /BL. More specifically, the internal power supply lines VIIZ and VSSX connect the power supply terminal of the WCL driving circuit 22 and the power supply terminal of the RCL driving circuit 24, which are aligned along the wiring direction (column direction) of the bit lines BL and /BL.

In this embodiment, the power source voltage VII is set to 1.2 V, and the threshold voltages (absolute value) of the pMOSs and the nMOSs of the WCL driving circuit 22 and the RCL driving circuit 24 are set to be as low as, for example, 0.25 V to maintain a high speed operation. The threshold voltages (absolute value) of the pMOS 18 and the nMOS 20 that are switching transistors are set to, for example, 0.45 V to reduce a sub-threshold leak current during their turning-off state. Since the transistors 18 and 20 connected in parallel are shared among the circuit blocks 16 even when the threshold voltages of the transistors 18 and 20 are made high, it is possible to prevent deterioration of the drivability of the transistors 18 and 20 only by increasing sizes of each transistor 18 and 20 a little. Similarly, even when a threshold voltage of the circuit in the circuit block 16 is decreased, the sub-threshold leak current flowing through the circuit during the standby state can be decreased by the pMOS 18 and the nMOS 20.

Furthermore, because the WCL driving circuit 22 is connected to the power supply lines VII via the plurality of pMOSs 18 arranged in parallel, it is possible to prevent a power source resistance of the WCL driving circuit 22 from being increased by the pMOSs 18, and a decrease in an operation speed of the circuit is suppressed. Similarly, since the RCL driving circuit 24 is connected to the ground lines VSS via the plurality of nMOSs 20 arranged in parallel, an increase in a ground resistance of the RCL driving circuit 24 is prevented by the nMOSs 20, and a decrease in the operation speed of the circuit is suppressed. Since the pMOSs 18 and the nMOSs 20 are dispersedly arranged in the memory core 14 as shown in FIG. 2, resistances of the internal power supply lines VIIZ and VSSX connecting the drains of the pMOS 18 and nMOS 20 should preferably be set to be as low as possible.

Figure 4:
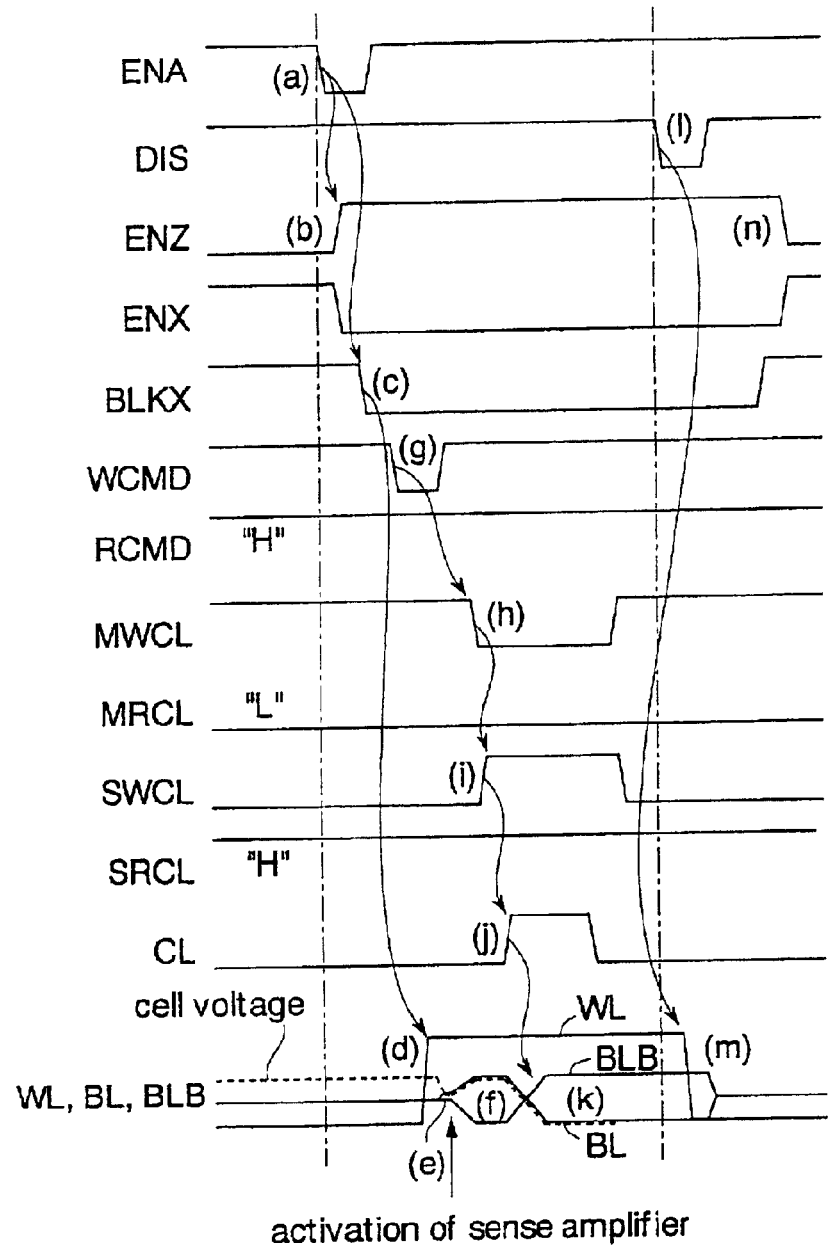
FIG. 4 is a timing chart showing an example of a write operation in the first embodiment.

FIG. 4 illustrates an example of a write operation for the memory cell array MA of the block 1 shown in FIG. 2. First, when the command signal CMD indicating an active command is input from the exterior, the control circuit 12 shown in FIG. 1 activates the enable signal ENA (FIG. 4(a)). Noted that the enable signal ENA may be activated when a command returning from the standby state is input instead of the active command. The control circuit 12 makes the enable signals ENZ and ENX high and low respectively, in response to the activation of the enable signal ENA (FIG. 4(b)). The plurality of pMOSs 18 and nMOSs 20 dispersedly arranged, which are shown in FIG. 2, are simultaneously turned on in response to the activation of the enable signals ENX and ENZ. The turning-on of the pMOSs 18 allows the internal power supply line VIIZ to be connected to the power supply lines VII. The turning-on of the nMOSs 20 allows the internal power supply line VSSZ to be connected to the ground lines VSS.

Next, the control circuit 12 activates the block selecting signal BLKX in response to the enable signal ENA and the address signal ADD (row address signal) supplied from the exterior (FIG. 4(c)). The word decoder arrays WD of the block 1 are activated in response to the block selecting signal BLKX, and the word line WL corresponding to the row address signal is activated (FIG. 4(d)). By activating the word line WL, data stored in the memory cell MC in the memory cell array MA of the block 1 is transmitted to the bit line BL (or /BL) (FIG. 4(e)).

Subsequently, the sense amplifier driving circuits in the circuit blocks 16 in the areas B and C adjacent to the block 1 are activated in response to the block selecting signal BLKX, and the sense amplifiers of the sense amplifier arrays SA in the areas B and C are activated. By the activation of each of the sense amplifier, a voltage difference between the bit line pair BL and /BL is amplified (FIG. 4(f)).

Next, when the command signal CMD indicating the write command is input from the exterior, the control circuit 12 shown in FIG. 1 activates the write command signal WCMD and the main write column line signal MWCL (FIGS. 4(g) and 4(h)).

The WCL driving circuits 22 (FIG. 3) in the areas B and C activate the sub-write column line signal SWCL in response to the activation of the main write column line signal MWCL (FIG. 4(i)). In other words, the WCL driving circuits 22 make the signal SWCL high in level. At this time, the WCL driving circuits 22 in the areas A and D receive the main write column line signal MWCL which is high in level, and are kept in the standby state. Therefore, a power source current flowing into the internal power supply line VIIZ via the pMOSs 18 is consumed only by the WCL driving circuits 24 in the areas B and C. As described above, the pMOSs 18 dispersedly arranged are connected to the internal power supply line VIIZ, and shared among the plurality of circuits operated at different timings, whereby a power supply capability for the operating circuits can be enhanced. As a result, in this example, it is possible to operate the WCL driving circuits 22 at a high speed, and to activate the sub-write column line signal SWCL quickly.

Next, a predetermined column selecting line CL is activated in response to the address signal (column address signal) input together with the write command (FIG. 4(j)), and write data input from the exterior is written to the memory cell MC via the bit lines BL and /BL (FIG. 4(k)).

Thereafter, the command signal CMD, for example, a precharge command, which indicates a disable command, is input from the exterior, and the disable signal DIS is activated (FIG. 4(l)). The word line WL is inactivated in response to the activation of the disable signal DIS, and the bit lines BL and /BL are precharged (FIG. 4(m)). Thereafter, the enable signals ENZ and ENX are inactivated after passage of a predetermined period of time, and the SDRAM is rendered in a standby state (FIG. 4(n)). By the inactivation of the enable signals ENZ and ENX, the pMOS 18 and the nMOS 20 are turned off and a power supply to the pMOS of the WCL driving circuit 22 which is in turning-off state and the nMOS of the RCL driving circuit 24 which is in turning-off state is cut off. Accordingly, a sub-threshold current during the standby state is significantly reduced.

Figure 5:
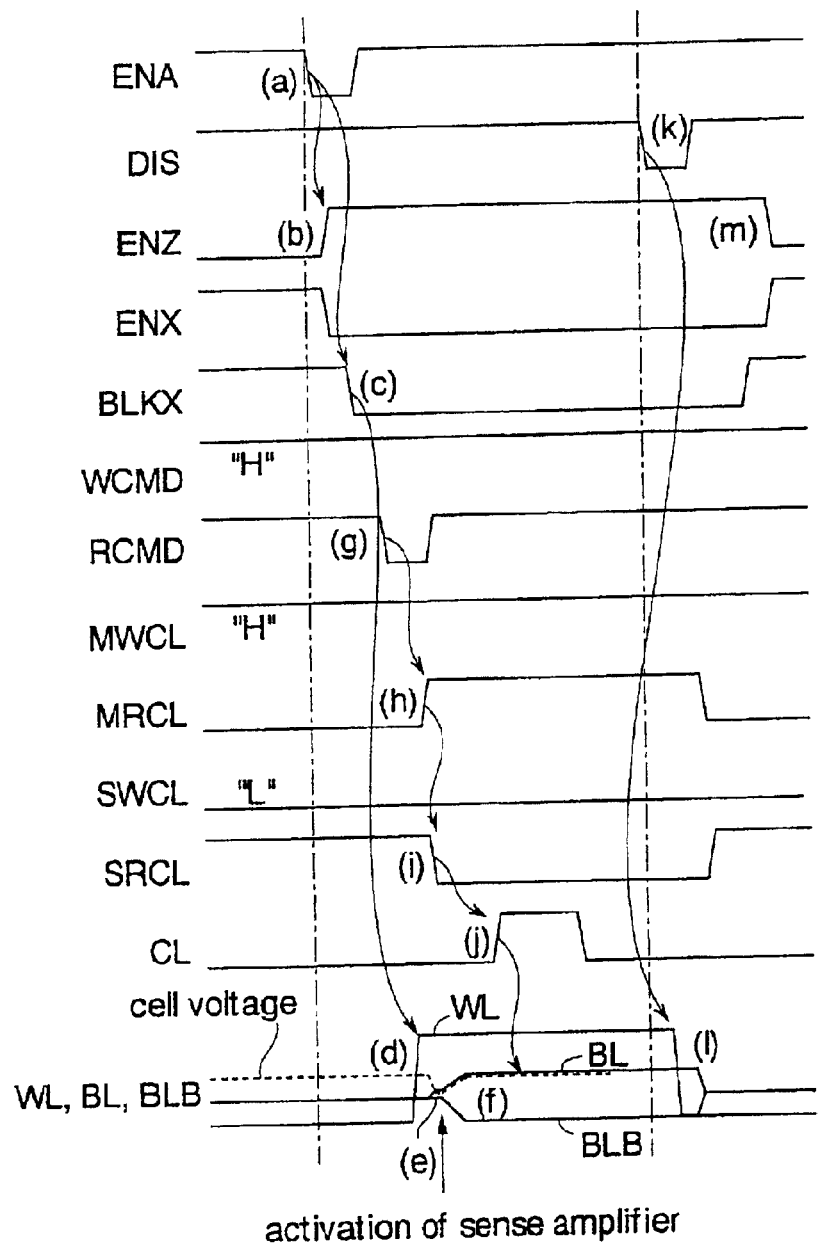
FIG. 5 is a timing chart showing an example of a read operation in the first embodiment.

FIG. 5 illustrates a read operation for the memory cell array MA of the block 1 shown in FIG. 2. Detailed descriptions for the same operation as those in FIG. 4 are omitted. First, the command signal CMD indicating an active command is input from the exterior, and the enable signal ENA is activated (FIG. 5(a)). The enable signals ENZ and ENX are respectively rendered to be high and low in level (FIG. 5(b)), and the pMOS 18 and the nMOS 20 shown in FIG. 2 are simultaneously turned on. The internal power supply line VIIZ is connected to the power supply line VII by the turning-on of the pMOS 18. The internal power supply line VSSZ is connected to the ground line VSS by the turning-on of the nMOS 20.

Next, the block selecting signal BLKX is activated in response to the address signal ADD (row address signal) from the exterior, and the word line WL corresponding to the row address signal is activated (FIG. 5(d)). Data stored in the memory cell MC is transmitted to the bit line BL (or /BL) by the activation of the word line WL (FIG. 5(e)).

Subsequently, the sense amplifier arrays SA of the areas B and C adjacent to the block 1 are activated in response to the block selecting signal BLKX, and the voltage difference in the bit line pair BL and /BL is amplified (FIG. 5(f)).

Next, when the command signal CMD indicating the read command is input from the exterior, the control circuit 12 shown in FIG. 1 activates the read command signal RCMD and the main read column line signal MRCL (FIGS. 5(g) and 5(h)).

The RCL driving circuits 24 in the areas B and C, which is shown in FIG. 3, activate the sub-read column line signal SRCL upon receipt of the main read column line signal MRCL (FIG. 5(i)). In other words, the RCL driving circuits 24 make the signal SRCL low in level. At this time, upon receipt of the low-level main read column line signal MRCL, the RCL driving circuits 24 in the areas A and D are kept in the standby state. Therefore, a source current flowing into the ground line VSS from the internal power supply line VSSZ via the nMOS 20 contributes only to the operation of the RCL driving circuits 24 in the areas B and C. As described above, the nMOSs dispersedly arranged are connected to the internal power supply line VSSZ, and these nMOSs are shared among a plurality of circuits operating at different timings, whereby a current draw-out capability for the operating circuits can be enhanced. As a result, in this example, it is possible to allow the WCL driving circuits 22 to operate speedily, and hence it is possible to allow the sub-read column line signal SRCL to be activated quickly.

Next, the predetermined column selecting line CL is activated in response to the address signal (column address signal) which is input together with the read command (FIG. 5(j)), and data amplified on the bit lines BL and /BL is read out.

Thereafter, the command signal CMD indicating a disable command is input from the exterior, and the disable signal DIS is activated (FIG. 5(k)). In response to the activation of the disable signal DIS, the word line WL is inactivated, and the bit lines BL and /BL are precharged (FIG. 5(l)). Subsequently, the enable signals ENZ and ENX are inactivated after passage of a predetermined period of time, and the SDRAM is rendered to be in the standby state (FIG. 5(m)).

In the above described write and read operations, the memory cell arrays MA of the blocks 0 and 2 are non-selected, and the sense amplifiers SA and the circuit groups GR in the areas A and D are non-selected without being activated.

As described in FIG. 3, the source of the pMOS of the WCL driving circuit 22 in the selected circuit group GR is connected to the power supply line VII via the plurality of pMOSs 18 dispersedly arranged in the memory core 14. Similarly, the source of the nMOS of the RCL driving circuit 24 is connected to the ground line VSS via the plurality of nMOSs 20 dispersedly arranged in the memory core 14. More specifically, the pMOSs 18 and the nMOSs 20 arranged in the non-selected circuit group GR, in operation at different timings, are shared, whereby a supply capability of the power source current is enhanced. In other words, even when sizes of the single pMOS 18 and the single nMOS 20 are small, the WCL driving circuit 22 and the RCL driving circuit 24 can be operated at a high speed by sharing the pMOSs 18 and nMOSs 20.

As described above, in this embodiment, the plurality of pMOSs 18 and the plurality of nMOSs 20, which are switching transistors, are connected in parallel via the internal power supply lines VIIZ and VSSX, and these pMOSs 18 and nMOSs 20 are shared among the circuit blocks 16 operating at the different timings. Therefore, the total size of the pMOSs 18 and the nMOSs 20 for the operating circuit blocks 16 can be made large, and the power supply capability and the current draw-out capability for the circuit blocks 16 can be enhanced. As a result, the operation speed of the circuit block 16 can be more increased compared to the conventional.

By sharing the plurality of pMOSs 18 and nMOSs 20 by the circuit blocks 16, the total size of the pMOSs 18 and the nMOSs 20 can be made smaller than that when the pMOSs 18 and the nMOSs 20 are arranged for each circuit block 16. As a result, the current (standby current) during the non-operation of the circuit block 16 can be reduced. Moreover, since the pMOSs 18 and the nMOSs 20 can be shared, the chip size can be reduced.

Accordingly, the high speed SDRAM can be constituted without increasing the standby current. Particularly, in the SDRAM constituting the circuit block 16 by the transistors with the reduced threshold voltages, both of the operation speed and the standby current can be satisfied.

The threshold voltages of the pMOS 18 and the nMOS 20 are set to be higher than the threshold voltages of the transistors of the circuit block 16. Since the plurality of pMOSs 18 and the plurality of nMOSs 20 are connected to each other in parallel, an increase in the chip size is suppressed to the minimum, leading to a further decrease in the sub-threshold leak current.

In the WCL driving circuit 22 and the RCL driving circuit 24 of the circuit block 16, the pMOSs 18 and the nMOSs 20 are connected only to the transistors required for reducing the standby current, and other transistors are directly connected to the power supply lines VII and VSS. Accordingly, the WCL driving circuit 22 and the RCL driving circuit 24 can be operated more speedily, and logic of the circuits can be settled also during the standby state.

The pMOSs 18 and the nMOSs 20 are arranged in a matrix form with intervals in between, and shared among the circuit blocks 16 aligned in the direction where the number of the circuit blocks 16 simultaneously operating is smaller. Therefore, the number of the pMOSs 18 and the nMOSs 20 for the circuit block 16 in operation can be made large, and the current supply capability per one circuit block 16 can be enhanced. As a result, it is possible to allow the circuit block 16 to operate at a high speed.

Since the pMOS 18 and the nMOS 20 are shared by the WCL driving circuit 22 and the RCL driving circuit 24, which are respectively the column control circuit and the array control circuit and operate at different timings, the WCL driving circuit 22 and the RCL driving circuit 24 can be allowed to be operated at a high speed, thus shortening an access time of the SDRAM.

Figure 6:
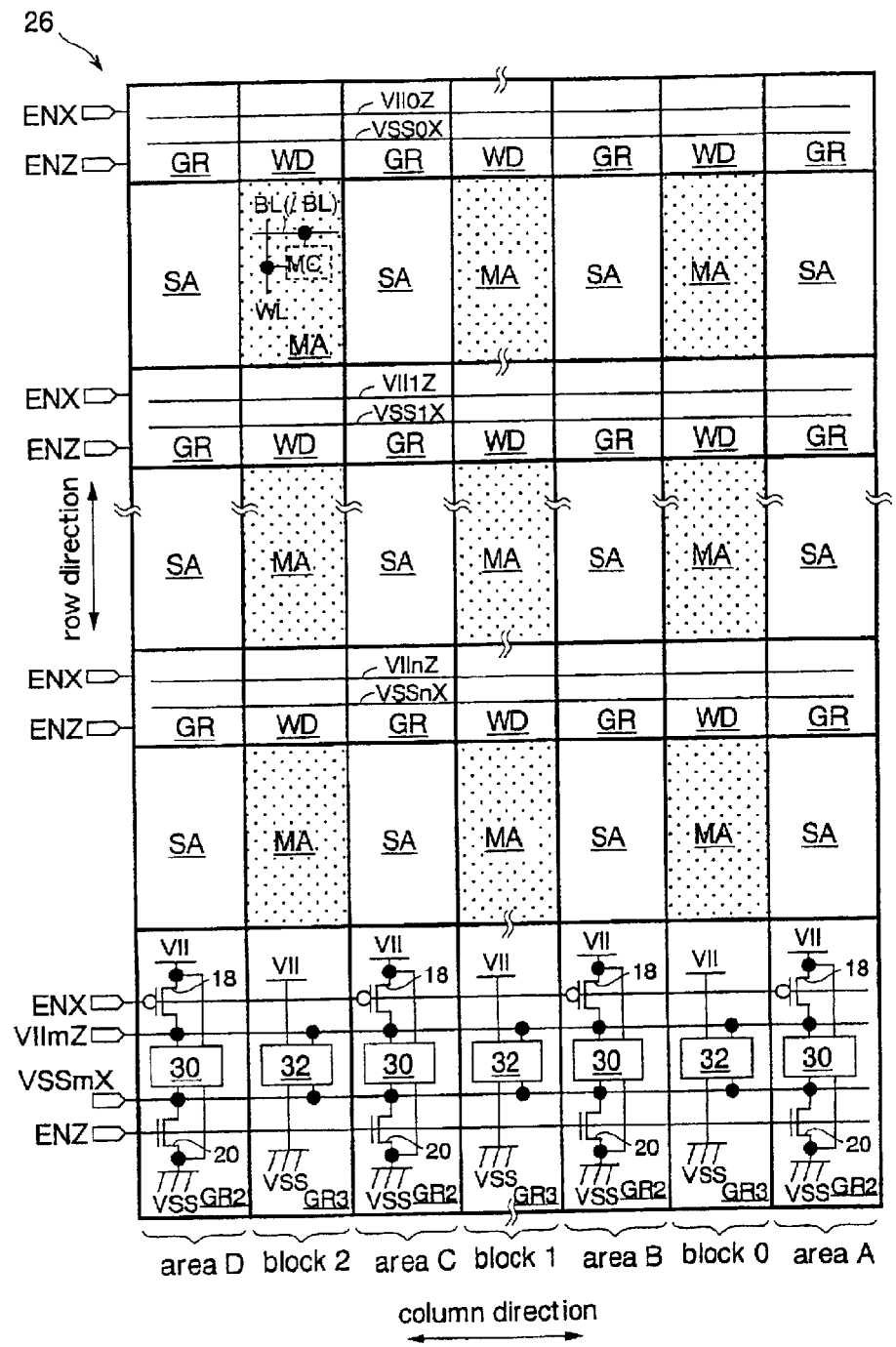
FIG. 6 is a block diagram showing the details of a memory core in a second embodiment of the present invention.

FIG. 6 is a second embodiment of a semiconductor integrated circuit of the present invention. The same circuits and signals as those described in the first embodiment are denoted by the same reference numerals and symbols, and detailed descriptions for them are omitted.

In this embodiment, the memory core 26 differs from the memory core 14 in the first embodiment. Other constitutions are approximately the same as the first embodiment. Specifically, the semiconductor integrated circuit of this embodiment is formed as a SDRAM on a silicon substrate by use of CMOS processes. The SDRAM has an input/output circuit 10, a control circuit 12 and the memory core 26, which are similar to those of the first embodiment.

The memory core 26 has a plurality of memory cell arrays MA arranged in a matrix form with intervals in between. Word decoder arrays WD are arranged in areas aligned in the column direction among areas adjacent to four sides of each memory cell array MA. Sense amplifier arrays SA are arranged in areas aligned in the row direction among the areas adjacent to the four sides of the memory cell array MA. On the exterior of the sense amplifier arrays SA disposed on both ends of FIG. 6, control circuits such as a column decoder, a read buffer, and a write amplifier, in operation in response to a column address, are arranged.

In areas adjacent to the four corners of the memory cell array MA, that is, in areas between the word decoder arrays WD aligned in the column direction as well as in areas between the sense amplifier arrays SA aligned in the row direction, circuit groups GR which are the same as those of the first embodiment are arranged, respectively. Common internal power supply lines VIIZ (VII0Z, VII1Z, ..., VIInZ) and VSSX (VSS0X, VSS1X, ..., VSSnX) are respectively wired to the circuit groups CR aligned in the column direction. The circuit groups GR receive enable signals ENZ and ENX. In the same manner as the first embodiment, the enable signals ENZ and ENX are generated by the control circuit 12 shown in FIG. 1.

In the end of the memory core 26 (the bottom of FIG. 6), the circuit groups GR2 are arranged in the areas adjacent to the sense amplifier arrays SA, and the circuit groups GR3 are arranged in the areas adjacent to the memory cell arrays MA. Specifically, another kind of circuit groups GR3 are arranged between the circuit groups GR2. These circuit groups GR2 and GR3 are dispersedly arranged in the column direction. In the memory core 26, any of the blocks 0 to 3 is activated during the write or read operation similarly to the first embodiment. Areas on both sides of the block activated are activated. Accordingly, the circuit blocks GR2 aligned in the column direction operate two by two, and the circuit groups GR3 aligned in the column direction are activated at different timings. Specifically, the circuit groups GR3 do not operate simultaneously.

Each of the circuit groups GR2 has the circuit block 30, the pMOS 18 and the nMOS 20. The pMOS 18 has a source connected to the power supply line VII, a drain connected to the circuit block 30, and a gate receiving the enable signal ENX. The nMOS 20 has a source connected to the ground line VSS, a drain connected to the circuit block 30, and a gate receiving the enable signal ENZ. The drains of the pMOS 18 and the nMOS 20 of each circuit group GR2 are connected to each other by the internal power supply lines VIImZ and VSSmZ respectively along the column direction. Noted that the circuit block 30 is directly connected also to the power source line VII and the ground line VSS.

Each of the circuit groups GR3 has the circuit block 32 (second circuit block). As described later, the circuit block 32 has the block selecting control circuit 38 for selecting a predetermined memory cell array MA corresponding to a row address signal. The block selecting control circuit 38 is connected to the internal power supply lines VIImZ and VSSmZ in addition to the power supply line VII and the ground line VSS. As described above, the pMOS 18 connected to the internal power supply line VIImZ and the nMOS 20 connected to the internal power supply line VSSmZ are shared by the circuit blocks 30 and 32.

Also in this embodiment, the power source voltage VII is set to 1.2 V, and the threshold voltages (absolute value) of the pMOS and the nMOS in the block circuits 16, 30 and 32 are set to 0.25 V. Furthermore, the threshold voltages (absolute value) of the pMOS 18 and the nMOS 20 that are switching transistors are set to 0.45 V.

Figure 7:
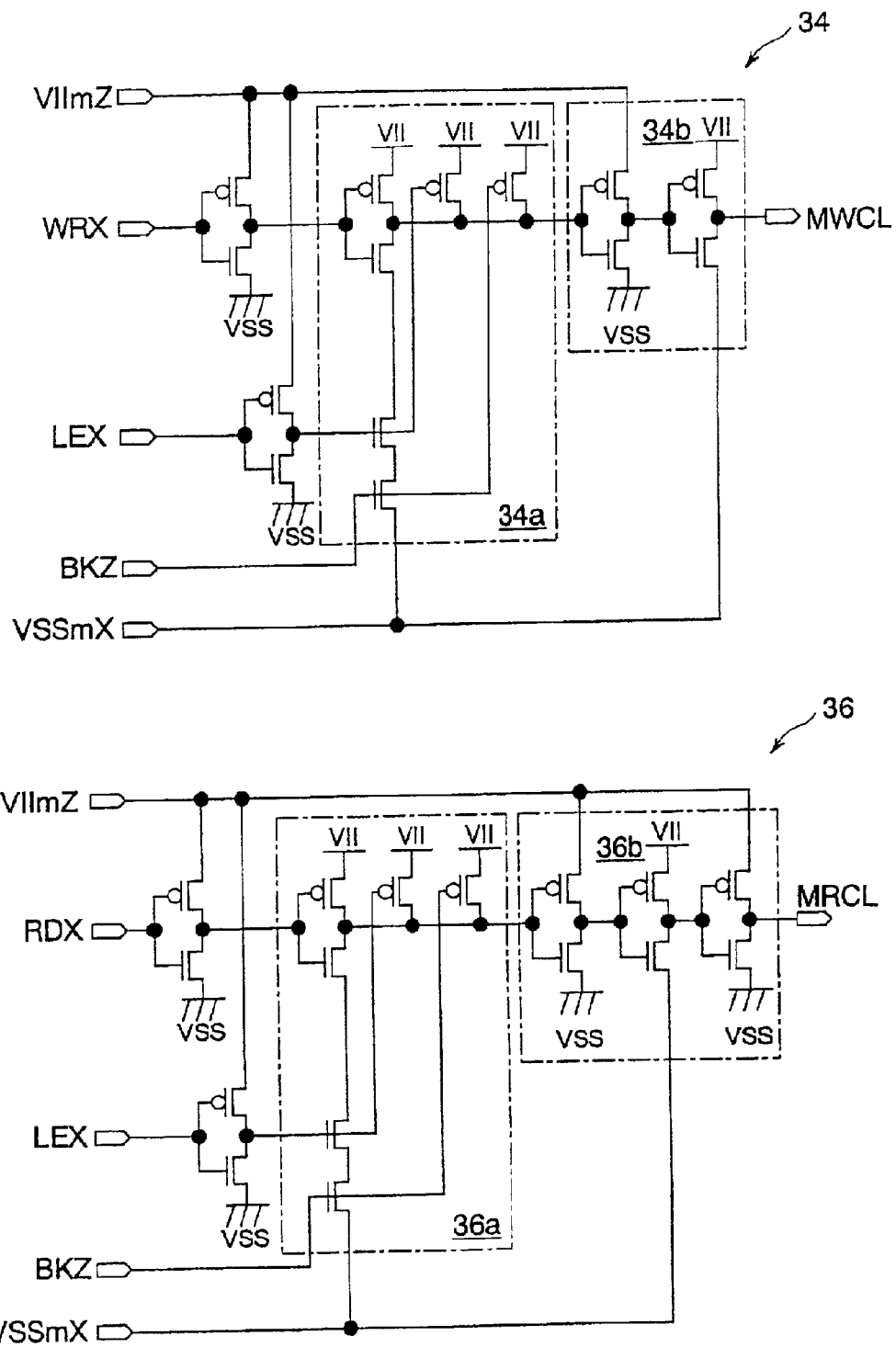
FIG. 7 is a circuit diagram showing examples of an MWCL generating circuit and an MRCL generating circuit which are arranged in the circuit block in a circuit group of FIG. 6.

FIG. 7 illustrates the MWCL generating circuit 34 and the MRCL generating circuit 36, which are arranged in the circuit block 30. The MWCL generating circuit 34 operates during the write operation of the SDRAM, and serves as a column control circuit for outputting the main write column line signal MWCL and as a read control circuit. The MRCL generating circuit 36 operates during the read operation of the SDRAM, and serves as a column control circuit for outputting the main read column line signal MRCL and as a write control circuit.

The MWCL generating circuit 34 has the NAND gate 34a and the buffer 34b which is connected to an output terminal of the NAND gate 34a to output the main write column line signal MWCL. The NAND gate 34a receives an inversion signal of the write control signal WRX, an inversion signal of the sense amplifier activating signal LEX and a bank selecting signal BKZ. The buffer 34b is constituted by two inverters connected in series.

The MRCL generating circuit 36 has the NAND gate 36a and the buffer 36b which is connected to an output terminal of the NAND gate 36a to output main read column line signal MRCL. The NAND gate 36a receives an inversion signal of the read control signal RDX, an inversion signal of the sense amplifier activating signal LEX and a bank selecting signal BKZ. The buffer 36b is constituted by three inverters connected in series. In the MWCL generating circuit 34 and the MRCL generating circuit 36, the sources of pMOSs (internal transistors) and nMOSs (internal transistors) which are turned off during the standby state are connected to the internal power supply lines VIImZ and VSSmZ, respectively.

Figure 8:
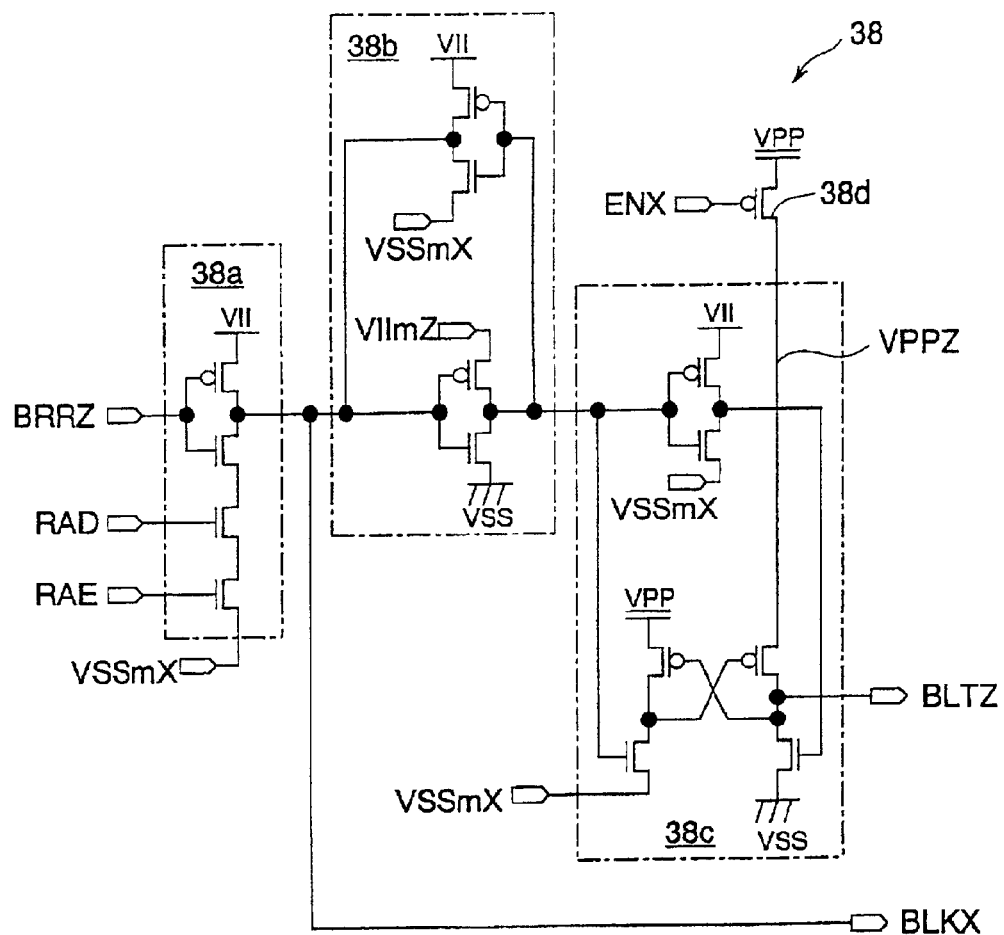
FIG. 8 is a circuit diagram showing an example of a block selecting control circuit arranged in a circuit block in a control circuit of FIG. 6.

FIG. 8 illustrates the block selecting control circuit 38 arranged in the circuit block 32 in the circuit group GR3. The block selecting control circuit 38 has the inverter 38a, the latch 38b and the level shifter 38c. The inverter 38a is activated when the block address signals RAD and RAE for selecting a predetermined memory cell array MA are high in level, and inverts the reset signal BRRZ for terminating precharge operations of the bit lines BL and /BL, thus outputting the block selecting signal BLKX. The latch 38b latches the block-selecting signal BLKX, and outputs the inversion signal BLKZ of the latched block-selecting signal BLKX. The level shifter 38c converts a high level of the inversion signal BLKZ to the boosted voltage VPP. In the level shifter 38c, a source of the PMOS outputting the boosted voltage VPP is connected to the internal power supply line VPPZ. The internal power supply line VPPZ is connected to the boosted power supply line VPP via the pMOS 38d. A gate of the pMOS 38d receives the enable signal ENX.

As described above, the block selection control signal 38 is activated by the block address signals RAD and RAE corresponding to the row address signal, and serves as the row control circuit for selecting the word line WL. In the block selecting control circuit 38, the source of the pMOS which is turned off during the standby state is connected to the internal power supply line VIImZ (or VPPZ), and the source of the nMOS which is turned off during the standby state is connected to the internal power supply line VSSmZ.

Figure 9:
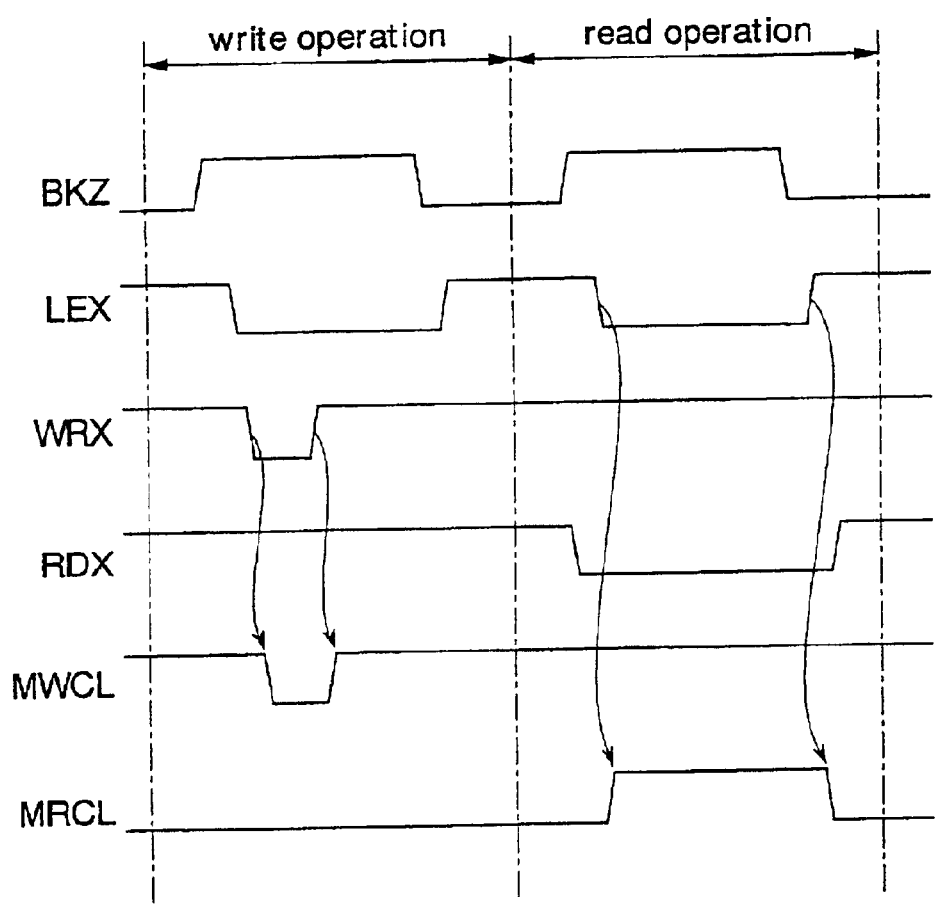
FIG. 9 is a timing chart showing operations of the MWCL generating circuit and the MRCL generating circuit of FIG. 7.

FIG. 9 shows operations of the MWCL generating circuit 34 and the MRCL generating circuit 36. During the write operation, the MWCL generating circuit 34 operates in response to the activation of the bank selecting signal BKZ, the sense amplifier activating signal LEX and the write control signal WRX, and the main write column line signal MWCL is activated. During the read operation, the MRCL generating circuit 36 operates in response to the activation of the bank selecting signal BKZ, the sense amplifier activating signal LEX and the read control signal RDX, and the main read column line signal MRCL is activated. The main write column line signal MWCL and the main read column line signal MRCL are activated in response to the write control signal WRX and the sense amplifier activating signal LEX which are activated for a short period.

In the SDRAM, the write operation and the read operation are never simultaneously executed for the same block. Specifically, the MWCL generating circuit 34 and the MRCL generating circuit 36 connected to the internal power supply lines VIImX and VSSmX never simultaneously operate. Furthermore, the MWCL generating circuit 34 and the MRCL generating circuit 36 connected to the internal power supply lines VIImZ and VSSmX operate two by two in number. Accordingly, the number of pMOSs 18 and nMOSs 20 for the MWCL generating circuit 34 and the MRCL generating circuit 36 which are being operated can be increased, and the read operation time and the write operation time of the SDRAM can be shortened.

Figure 10:
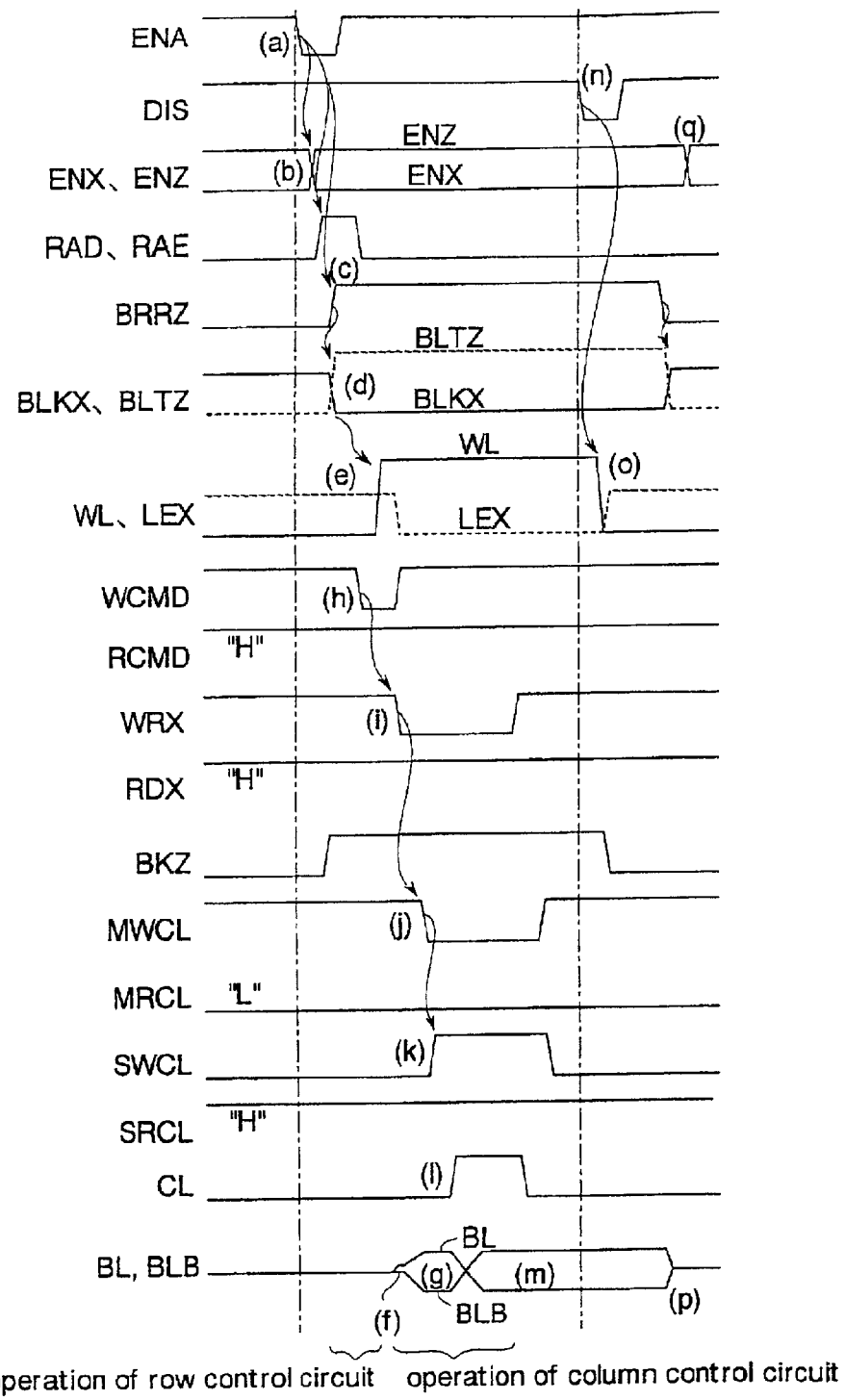
FIG. 10 is a timing chart showing an example of a write operation in the second embodiment.

FIG. 10 shows an example of executing the write operation for the memory cell array MA of the block 1. Detailed descriptions for the same operations as those of FIG. 4 are omitted. First, the command signal CMD indicating an active command is input from the exterior, and the enable signal ENA is activated (FIG. 10(a)). The enable signals ENZ and ENX are respectively changed to be high and low in level in response to the enable signal ENA (FIG. 10(b)), and the pMOS 18 and nMOS 20 shown in FIG. 6 and the PMOS 38d shown in FIG. 8 are turned on. The turning-on of the pMOS 18 allows the internal power supply line VIIZ to be connected to the power supply line VII. The turning-on of the nMOS 20 allows the internal power supply line VSSZ to be connected to the ground line VSS. The turning-on of the pMOS 38d allows the internal power supply line VPPZ to be connected to the boosted power supply line VPP.

Next, the block address signals RAD and RAE are activated, and the reset signal BRRZ of the precharge is activated (FIG. 10(c)). Upon the activation of the reset signal BRRZ, the block selecting control circuit 38 illustrated in FIG. 8 activates the block selecting signals BLKX and BLTZ (FIG. 10(d)). Herein, the block-selecting signal BLTZ is risen up to the boosted voltage VPP by the level shifter 38c of the block selecting control circuit 32. Only one of the block selecting control circuits 38 corresponding to the block address signals RAD and RAE, which is connected to the internal power supply lines VIImZ, VSSmZ and VPPZ, is activated. Accordingly, the number of the pMOSs 18 and the nMOSs 20 corresponding to the block selecting control circuit 38 in operation can be increased, and a current supply capability per one block selecting control circuit 38 can be enhanced. As a result, it is possible to allow the block selecting control circuit 38 to operate at a high speed.

The block selecting signals BLKX and BLTZ are transmitted to a cell array selection circuit (not shown) included in the circuit group GR2 shown in FIG. 6. The sense amplifier array SA in the area B and the memory cell array MA of the block 0 are separated by the cell array selection circuit, and the sense amplifier array SA in the area C and the memory cell array MA of the block 2 are separated by the cell array selection circuit. Furthermore, the precharge operation of the memory cell array MA of the block 1 is cancelled. At this time, the MWCL generating circuit 34 that is a column control circuit does not begin to operate yet.

Next, the word line WL and the sense amplifier activating signal LEX of the block 1 are activated in response to the block selecting signal BLKX, the row address signal and a timing signal (not shown) (FIG. 10(e)). The sense amplifier-activating signal LEX is supplied to the MWCL generating circuit 34 and the MRCL generating circuit 36 shown in FIG. 7. Data stored in the memory cell MC is transmitted to the bit line BL (or /BL) by the activation of the word line WL (FIG. 10(f)). A voltage difference between the bit line pair BL and /BL is amplified by the activation of the sense amplifier (FIG. 10(g)).

Subsequently, the command signal CMD indicating a write command is input from the exterior, and the write command signal WCMD is activated (FIG. 10(h)). The write control signal WRX is activated in response to the write command signal WCMD (FIG. 10(i)). Upon the activation of the write control signal WRX, the MWCL generating circuit 34 shown in FIG. 7 activates the main write column line signal MWCL (FIG. 10(j)). Upon the activation of the main write column line signal MWCL, the WCL driving circuit 22 shown in FIG. 3 activates the sub-write column line signal SWCL (FIG. 10(k)). Then, a predetermined column selecting line CL is activated in response to an address signal (column address signal) input to the memory cell array MA together with the write command (FIG. 10(l)), and write data input from the exterior is written to the memory cell MC via the bit lines BL and /BL (FIG. 10(m)).

Next, the command signal CMD indicating the disable command, for example, the precharge command, is input from the exterior, and the disable signal DIS is activated (FIG. 10(n)). The word line WL of the block 1 is inactivated in response to the disable signal DIS (FIG. 10(o)), and the bit lines BL and /BL are precharged (FIG. 10(p)). Thereafter, the enable signals ENZ and ENX are inactivated after passage of a predetermined period of time, and the SDRAM falls into the standby state (FIG. 10(q)).

As described above, the block selecting control circuit 38 formed in the circuit block 32, which is the row control circuit, and the MWCL generating circuit 34 formed in the circuit block 30, which is the column control circuit, operate at different timings, respectively. Accordingly, the number of the pMOSs 18 and the nMOSs 20 for the circuit blocks 30 and 32 in operation can be increased, and a current supply capability for one circuit block can be enhanced. As a result, it is possible to allow the MWCL generating circuit 34 and the block selecting control circuit 38 to operate at a high speed, respectively.

Figure 11:
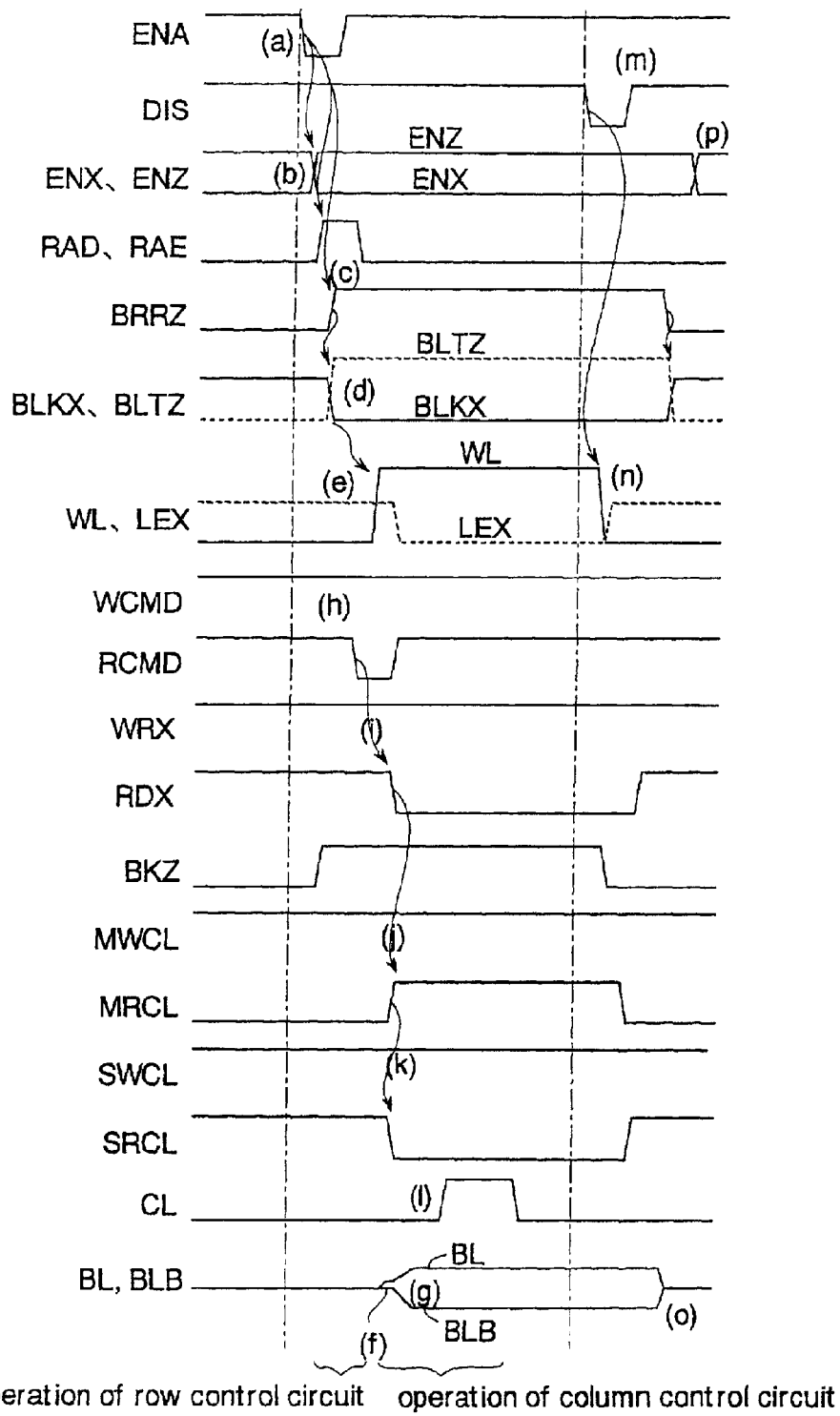
FIG. 11 is a timing chart showing an example of a read operation in the second embodiment.

FIG. 11 shows an example of executing the read operation for the memory cell array MA of the block 1. Detailed descriptions for the same operations as those described above are omitted. First, the command signal CMD indicating an active command is input from the exterior, and the enable signal ENA is activated (FIG. 11(a)). The enable signals ENZ and ENX change to be high and low in level, respectively (FIG. 11(b)), and the pMOS 18 and nMOS 20 shown in FIGS. 2 and 6 and the pMOS 38d are turned on.

Next, the block address signals RAD and RAE are activated, and the reset signal BRRZ of the precharge is activated (FIG. 11(c)). In response to the activation of the reset signal BRRZ, the block selecting signals BLKX and BLTZ are activated (FIG. 11(d)). At this time, the MRCL generating circuit 36 that is a column control circuit does not begin to operate yet. The word line WL and the sense amplifier-activating signal LEX of the block 1 are activated in response to the row address signal (FIG. 11(e)). Data stored in the memory cell MC is transmitted to the bit line BL (or /BL) by the activation of the word line WL (FIG. 11(f)). A voltage difference between the bit line pair BL and /BL is amplified by the activation of the sense amplifier (FIG. 11(g)).

Then, the command signal CMD indicating a read command is input from the exterior, and the read command signal RCMD is activated (FIG. 11(h)). The MRCL generating circuit 36 shown in FIG. 7 activates the main read column line signal MRCL upon the activation of the read control signal RDX (FIG. 11(j)). The RCL driving circuit 22 shown in FIG. 3 activates the sub-read column line signal SRCL upon the activation of the main read column line signal MRCL (FIG. 11(k)). Subsequently, a predetermined column selection line CL is activated in response to an address signal (column address signal) input together with the read command, and data amplified on the bit lines BL and /BL are read out.

Thereafter, similarly to FIG. 10, the command signal CMD indicating a disable command is input from the exterior, and the disable signal DIS is activated (FIG. 11(m)). Subsequently, the word line WL is inactivated (FIG. 11(n)), and the bit lines BL and /BL are precharged (FIG. 11(o)). Thus, the enable signals ENZ and ENX are inactivated, and the SDRAM falls into the standby state (FIG. 11(p)).

Also during the read operation, only one of the block selecting control circuits 38 corresponding to the block address signals RAD and RAE is activated. Since the number of the pMOSs 18 and the nMOSs 20 corresponding to the block selecting control circuit 38 in operation can be increased, a current supply capability per the block selecting control circuit 38 can be enhanced. Furthermore, the block selecting control circuit 38 in the circuit block 32 and the MRCL generating circuit 36 in the circuit block 30 operate at different timings, respectively. Accordingly, the number of the pMOSs 18 and the nMOSs 20 corresponding to the circuit blocks 30 and 32 in operation can be increased, and a current supply capability per each circuit block can be enhanced.

Also in this embodiment, the same effects as those of the first embodiment can be obtained. In addition, in this embodiment, the MRCL generating circuit 36 operating during the read operation and the MWCL generating circuit 34 operating during the write operation are connected to each other with the internal power supply lines VIImZ and VSSmX. The MWCL generating circuit 34 of and the MRCL generating circuit 36 of the circuit block 30 connected to the internal power supply lines VIImZ and VSSmX, and the block selecting control circuit 38 of the circuit block 32 connected thereto are allowed to operate at the different timings. The MWCL generating circuits 34 connected to the internal power supply lines VIImZ and VSSmX are allowed to operate at the timings different from each other. The MRCL generating circuits 36 connected to the internal power supply lines VIImZ and VSSmX are allowed to operate at the timings different from each other. Similarly, the block selecting control circuits 38 connected to the internal power supply lines VIImZ and VSSmX are allowed to operate at the timings different from each other. Accordingly, the number of the pMOSs 18 and the nMOSs 20 for the circuits in operation can be increased, and hence these circuits can be operated at a high speed. As a result, the SDRAM can be operated at a high speed.

Since the pMOS 18 and the nMOS 20 are connected only to transistors necessary for decreasing the standby current in the MWCL generating circuit 34, the MRCL generating circuit 36 and the block selecting control circuit 38 and other transistors are directly connected to the power supply lines VII and VSS, these circuits can be operated at a higher speed, and logic of the circuits can be established during the standby state.

Noted that, in the foregoing embodiment, the example in which the present invention is applied to the SDRAM is described. However, the present invention is not limited to such an embodiment. For example, the present invention may be applied to other semiconductor memories such as SRAMs or to logic LSIs. Furthermore, the present invention may be applied to system LSIs loading a DRAM core.

In the foregoing first embodiment, the example in which the pMOSs 18 and the nMOSs 20 aligned in the column direction in the memory core 14 are respectively connected to each other in parallel and these pMOSs 18 and nMOSs 20 are shared by the WCL driving circuit 22 and the RCL driving circuit 24 which respectively operate at different timings is described. However, the present invention is not limited to such an embodiment. For example, the pMOSs 18 and the nMOSs 20 aligned in the row direction in the memory core 14 are connected to each other in parallel, and these pMOSs 18 and nMOSs 20 may be shared among the control circuits in operation at different timings. As an example of the control circuits, there are a column decoder, a read amplifier, a write amplifier and the like, which are arranged plurally in the row direction.

In the foregoing first embodiment, the example is described, in which the column control circuits (the WCL driving circuit 22 and the RCL driving circuit 24) in operation at different timings are connected by the internal power supply lines VIIZ and VSSX. However, the present invention is not limited to such an embodiment. For example, row control circuits operating at different timings may be connected by the internal power supply lines VIIZ and VSSX. Furthermore, write control circuits and read control circuits in operation at different timings may be connected by the internal power supply lines VIIZ and VSSX.

In the foregoing embodiment, the example is described, in which the precharge operation after the write and read operations and the turning-off operations of the pMOS 18 and the nMOS 20 are performed in response to the disable command. However, the present invention is not limited to such an embodiment. For example, the precharge operation and the turning-off operations of the pMOS 18 and the nMOS 20 may be performed in response to another command.

In the foregoing embodiment, the example is described, in which the word decoder arrays WD are arranged in the areas adjacent to the memory cell array MA in the column direction. However, the present invention is not limited to such an embodiment. For example, these areas may be used as contact areas of a word strap structure. The word strap structure has a structure that word lines are formed by wiring, for example polysilicon, which is a lower layer having a relatively higher resistance, and a wiring, for example aluminium which is a upper layer having a relatively lower resistance layer, The invention is not limited to the above embodiments and various modifications may be made without departing from the spirit and scope of the invention. Any improvement may be made in part or all of the components.

What is claimed is:

1. A semiconductor integrated circuit, comprising:
a plurality of first circuit blocks;
a plurality of switching transistors for connecting power supply terminals of said first circuit blocks to a power supply line, respectively;

an internal power supply line for connecting to each other said power supply terminals of said first circuit blocks operating at different timings among said first circuit blocks; and a power supply control circuit for simultaneously turning on said switching transistors connected to said internal power supply line, in response to operation(s) of at least any one of said first circuit blocks connected to said internal power supply line.

2. The semiconductor integrated circuit according to claim 1, wherein threshold voltages of said switching transistors are higher than the threshold voltages of internal transistors included in said first circuit blocks.

3. The semiconductor integrated circuit according to claim 1, wherein:

said first circuit blocks each includes a plurality of internal transistors; and said power supply line is connected to source electrodes of said internal transistors turned off during a standby state of the semiconductor integrated circuit via said internal power supply line and said switching transistors, in each of said first circuit blocks.

4. The semiconductor integrated circuit according to claim 1, wherein said switching transistors and said first circuit blocks are dispersedly arranged.

5. The semiconductor integrated circuit according to claim 4, wherein:

said switching transistors and said first circuit blocks are arranged in a matrix form with intervals in between; and said internal power supply line connects to each other said power supply terminals of said part of said first circuit blocks, the connection done along a line with a smaller number of first circuit blocks operating simultaneously.

6. The semiconductor integrated circuit according to claim 4, wherein:

said switching transistors and said first circuit blocks are arranged in a matrix form with intervals in between;

said first circuit blocks aligned in one direction operate simultaneously;

said first circuit blocks aligned in a direction perpendicular to said one direction operate at different timings; and said internal power supply line connects said power supply terminals of said first circuit blocks to each other, the first circuit blocks being aligned in said direction perpendicular to said one direction.

7. The semiconductor integrated circuit according to claim 4, comprising:

a plurality of rectangular memory cell arrays arranged in a matrix form with intervals in between, each having memory cells each connected to a word line and a bit line;

said first circuit blocks arranged in areas adjacent to four corners of said memory cell arrays, each including array control circuits for controlling said memory cell arrays and said switching transistors; and said internal power supply line connecting power supply terminals of said array control circuits to each other, which are aligned in one of wiring directions of said word line and said bit line.

8. The semiconductor integrated circuit according to claim 7, wherein said array control circuits connected by said internal power supply line are column control circuits for inputting/outputting data transmitted to said bit line.

9. The semiconductor integrated circuit according to claim 7, wherein said array control circuits connected by said internal power supply line are row control circuits for selecting said word line.

10. The semiconductor integrated circuit according to claim 7, wherein each of said array control circuits connected by said internal power supply line includes a column control circuit for inputting/outputting data transmitted to said bit line and a row control circuit for selecting said word line.

11. The semiconductor integrated circuit according to claim 7, wherein each of said array control circuits connected by said internal power supply line includes a read control circuit operating during a read operation and a write control circuit operating during a write operation.

12. The semiconductor integrated circuit according to claim 4, comprising a plurality of memory cell arrays each having memory cells each connected to a word line and a bit line, wherein each of said first circuit blocks connected by said internal power supply line includes a read control circuit operating during a read operation and a write control circuit operating during a write operation.

13. The semiconductor integrated circuit according to claim 4, further comprising:

second circuit blocks respectively arranged between said first circuit blocks connected by said internal power supply line, said second circuit blocks operating at different timings from said first circuit blocks; and power supply lines of said second circuit blocks connected to said internal power supply line.

14. The semiconductor integrated circuit according to claim 13, wherein:

said second circuit blocks each includes a plurality of internal transistors; and said power supply line is connected to source electrodes of said internal transistors turned off during a standby state of the semiconductor integrated circuit via said internal power supply line and said switching transistors, in each of said second circuit blocks.

15. The semiconductor integrated circuit according to claim 13, wherein said second circuit blocks operate at different timings from each other.

16. The semiconductor integrated circuit according to claim 13, comprising a plurality of memory cell arrays each having memory cells each connected to a word line and a bit line, wherein said first circuit blocks connected by said internal power supply line are column control circuits for inputting/outputting data transmitted to said bit line; and said second circuit blocks are row control circuits for selecting said word line.

* * * * *